(12) United States Patent
Sheng et al.

(10) Patent No.: US 8,003,980 B2
(45) Date of Patent: Aug. 23, 2011

(54) LAYERED ELECTRO-ORGANIC DEVICES WITH CROSSLINKED POLYMER AND METHODS OF PREPARING THE SAME

(75) Inventors: Xia Sheng, Palo Alto, CA (US);
Zhang-Lin Zhou, Palo Alto, CA (US);
Krzysztof Nauka, Palo Alto, CA (US);
Chung Ching Yang, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1241 days.

(21) Appl. No.: 11/700,447

(22) Filed: Jan. 30, 2007

(65) Prior Publication Data
US 2010/0133515 A1    Jun. 3, 2010

(51) Int. Cl.
*H01L 29/08* (2006.01)
*H01L 35/24* (2006.01)
*H01L 51/00* (2006.01)

(52) U.S. Cl. ........... 257/40; 257/E21.024; 257/E51.001; 257/E51.002; 257/E51.003; 257/E51.004; 257/E51.005; 257/E51.006; 257/E51.008; 257/E51.009; 257/E51.022; 257/E51.023; 257/E51.024; 257/E51.025; 257/E51.026

(58) Field of Classification Search ............ 257/40, 257/E21.024, E51.001–E51.006, E51.008, 257/E51.009, E51.022–E51.026
See application file for complete search history.

(56) References Cited

U.S. PATENT DOCUMENTS

| | | | |
|---|---|---|---|
| 5,460,911 A | 10/1995 | Yu | |
| 5,466,551 A * | 11/1995 | Yuh et al. | 430/63 |
| 5,501,821 A * | 3/1996 | Willand et al. | 252/582 |
| 5,874,193 A * | 2/1999 | Liu et al. | 430/58.8 |
| 6,015,645 A | 1/2000 | Murti | |
| 6,107,452 A | 8/2000 | Miller | |
| 6,174,636 B1 * | 1/2001 | Fuller et al. | 430/58.7 |
| 6,614,578 B2 * | 9/2003 | Giri et al. | 359/265 |
| 6,661,563 B2 | 12/2003 | Hayashi et al. | |
| 7,109,651 B2 * | 9/2006 | Nakamura et al. | 313/504 |
| 7,118,845 B2 * | 10/2006 | DeVoe et al. | 430/270.1 |
| 7,119,409 B2 | 10/2006 | Kawamura et al. | |
| 7,148,508 B2 | 12/2006 | Miyazawa | |
| 7,166,010 B2 | 1/2007 | Lamansky et al. | |
| 7,265,379 B2 * | 9/2007 | Sandberg et al. | 257/40 |
| 7,362,515 B2 * | 4/2008 | Miyazawa | 359/722 |
| 7,402,834 B2 * | 7/2008 | Mutsaers et al. | 257/40 |
| 7,435,682 B2 * | 10/2008 | Matsui et al. | 438/691 |
| 7,629,061 B2 * | 12/2009 | Gupta et al. | 428/690 |
| 7,655,961 B2 * | 2/2010 | Marrocco et al. | 257/184 |
| 7,718,277 B2 * | 5/2010 | Chichak et al. | 428/690 |
| 7,763,365 B2 * | 7/2010 | Takeuchi et al. | 428/690 |
| 2004/0067450 A1 * | 4/2004 | Leatherdale et al. | 430/322 |
| 2005/0186106 A1 * | 8/2005 | Li et al. | 420/500 |
| 2007/0128874 A1 * | 6/2007 | Shida et al. | 438/692 |
| 2007/0274664 A1 * | 11/2007 | van Veggel et al. | 385/142 |
| 2008/0026477 A1 * | 1/2008 | Cella et al. | 436/84 |
| 2008/0138655 A1 * | 6/2008 | Lecloux et al. | 428/690 |
| 2010/0090586 A1 * | 4/2010 | Chichak et al. | 313/504 |

* cited by examiner

*Primary Examiner* — Ida M Soward

(57) ABSTRACT

The present invention is drawn to a layered organic device, and a method of forming the same. The method includes steps of applying a first solvent-containing organic layer to a substrate and removing solvent from the first solvent-containing organic layer to form a first solidified organic layer. Additional steps include applying a second solvent-containing organic layer to the first solidified organic layer and removing solvent from the second solvent-containing organic layer to form a second solidified organic layer. The first solidified organic layer can be crosslinked, which suppresses negative impact to components in the first solidified organic layer when the solvent of the second solvent-containing organic layer is deposited on the first solidified organic layer.

24 Claims, 2 Drawing Sheets

LAYERED ELECTRO-ORGANIC DEVICES WITH CROSSLINKED POLYMER AND METHODS OF PREPARING THE SAME

BACKGROUND OF THE INVENTION

Advanced organic/polymeric devices frequently consist of a stack of organic/polymeric thin layers, each one performing a specific function aimed at improving the device performance or achieving the desired device functionality. In some cases, such devices utilize nanoscale features (inorganic and/or organic nanocrystals and/or molecules) at desired sites within the thin film stack. In polymeric devices, these layered structures are usually formed from a polymer solution or dispersion by spin-casting or other coating and printing processes, followed by removal of the coating solvent, and then subsequent deposition of another layer being deposited on the previous layer. When new layers are applied which also include a solvent, frequently, the solvent from the freshly deposited layer can dissolve or partially dissolve the underlying layer(s), or introduce other changes to the properties of the organic layer, e.g., swelling, chemical modification, density change, washing out of desired components, etc. resulting in loss of the desired structure and/or corresponding device functionality. For example, in a device that utilizes precisely positioned or area positioned nanocrystals, when applying subsequent layers, these nanocrystals can be redistributed (after desired deposition) within the organic layer.

Because of the problems associated with layered deposition within these types of devices, it would be desirable to provide methods of depositing layers with minimal negative impact on previously applied layers.

DETAILED DESCRIPTION OF THE PREFERRED EMBODIMENT(S)

Figure 1:
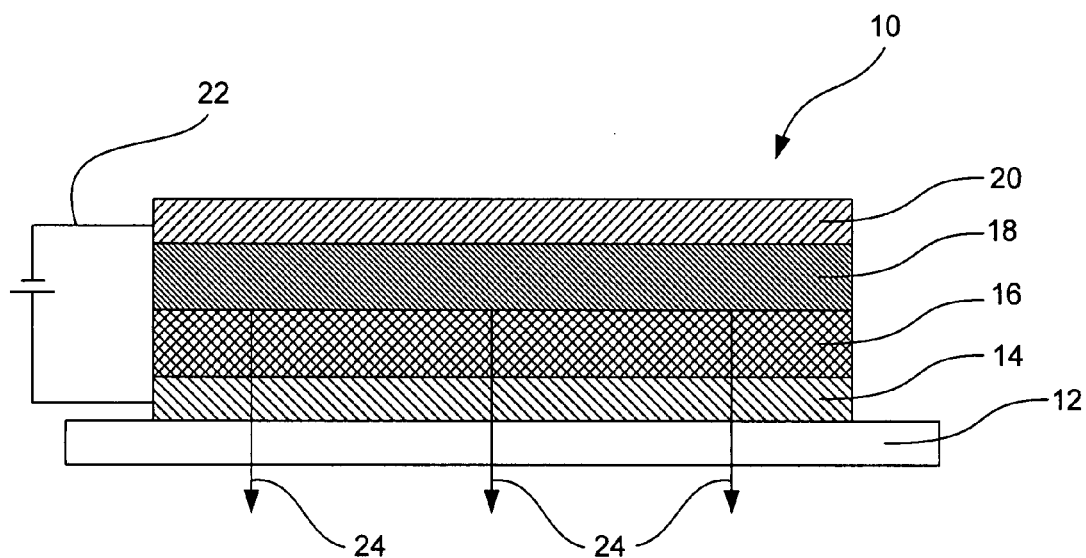
FIG. 1 depicts one specific type of device that can be prepared in accordance with embodiments of the present invention.

Before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a polymer" includes reference to one or more of such materials.

The term "solvent" can mean a single solvent or a plurality of solvents, depending on the context.

The acronym "HTL" shall mean hole transport layer.

The acronym "ETL" shall mean electron transport layer.

The term "solvent-containing organic layer" refers to a layer of a formulation applied to a substrate where the solvent can be removed to leave a "solidified organic layer." Often, the solidified organic layer is a polymeric layer, or includes a polymeric matrix that provides structure to the layer. At least one "solidified organic layer" can be crosslinked in accordance with embodiments of the present invention. The crosslinking can be carried out by including crosslinkable polymers or materials in a layer, or applying such materials to a pre-applied layer.

The term "electro-organic device" refers to a device, usually a thin device, that includes a plurality of organic layers. Often the entire device is less than about 1500 Angstroms, though thicker and thinner devices can be prepared in accordance with embodiments of the present invention. Examples of such devices can include photodiodes, light-emitting diodes (LEDs), Schottky diodes, organic electroluminescent (EL) devices, light-emitting organics (LEOs), photovoltaic cells, field effect transistors, phototransistors, thin-film transistors, organic transistors, organic resistors, phosphorescent OLEDs, organic semiconductor lasers, organic and inorganic hybrid devices, photoreceptors, conductors, photoconductors such as organic photoconductors for laser printers, copiers and/or Indigo engines, or the like.

As used herein, a plurality of components may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 0.01 to 2.0" should be interpreted to include not only the explicitly recited values of about 0.01 to about 2.0, but also include individual values and sub-ranges within the indicated range. Thus, included in this numerical range are individual values such as 0.5, 0.7, and 1.5, and sub-ranges such as from 0.5 to 1.7, 0.7 to 1.5, and from 1.0 to 1.5, etc. This same principle applies to ranges reciting only one numerical value. Furthermore, such an interpretation should apply regardless of the breadth of the range or the characteristics being described.

With this in mind, a method of forming a layered electro-organic device can comprise multiple steps, including applying a first solvent-containing organic layer to a substrate and removing solvent from the first solvent-containing organic layer to form a first solidified organic layer. Additional steps include applying a second solvent-containing organic layer to the first solidified organic layer and removing solvent from the second solvent-containing organic layer to form a second solidified organic layer. In this embodiment, the first solidified organic layer can be crosslinked, which suppresses negative impact to the first solidified organic layer when the solvent of the second solvent-containing organic layer is deposited on the first solidified organic layer. For example, the negative impact that can be suppressed can be dissolution, mobilization of components, swelling, chemical modification, density change, and/or washing out of desired components with respect to mechanical, optical, or electrical properties of the first solidified organic layer.

In another embodiment, a layered electro-organic device can comprise a first solidified organic layer deposited on a substrate, wherein the first solidified organic layer includes a crosslinked polymer. The device further includes a second solidified organic layer directly deposited on the first solidified organic layer. The first solidified organic layer and the second solidified organic layer can be formulated and configured for electrical communication with one another. Further, in one embodiment, the first solidified organic layer and the second solidified organic layer can collectively be no more than 100 µm in thickness. In one specific embodiment, this device can be prepared in accordance with the method steps described above.

It should be noted that various details are provided herein which are applicable to each of the method and the device. Thus, discussion of one specific embodiment is related to and provides support for discussion in the context of other related embodiments.

In further detail with respect to the methods and devices described herein, reference to a substrate for application of a first solvent-containing organic layer can be any substrate, including a support substrate, such as ceramic, plastic, stainless steel, glass, silicon-based substrates, etc. However, the substrate can also be any other material or previously applied layer that is applied to the support substrate, including such structures as cathodes, anodes, previously applied organic thin film or other types of layers, etc. Further, though the first solidified organic layer is described as including a crosslinked polymer, it is noted that the second solidified organic layer (or any other layer) can also include a crosslinked polymer. It is further noted that the first solidified organic layer can be a crosslinked polymer layer, and in another embodiment, the layer can include a crosslinked polymer, such as in the form of a polymer matrix. For example, a crosslinked polymer matrix can be used to carry or support other components in the layer, e.g., fluids, another polymer, small molecules, nanoscale features including crystals and molecules, etc. It should also be noted that the crosslinked polymer can be present in any layer, including both functional layers, or applied as protective layers over functional layers.

Regarding the formation of the crosslinked organic layer, in one embodiment, the first solvent-containing organic layer can include a UV (or other photo-energy) crosslinkable polymer, and the solidified organic layer can be formed and crosslinked using UV (or other photo) energy. In another embodiment, the first solvent-containing organic layer can include a thermal crosslinkable polymer, and the solidified organic layer can be formed and crosslinked using thermal energy.

When preparing the layers, in one embodiment, the solvent of the first solvent-containing organic layer and the solvent of the second solvent-containing organic layer can have at least one specific solvent in common. In another embodiment, the solvent of the first solvent-containing organic layer and the solvent of the second solvent-containing organic layer can be the same, e.g., only one solvent in each and they are the same, or alternatively, both have multiple solvents in a solvent vehicle and the solvent vehicle in each is the same. When using a solvent in common or the same solvent (vehicle) in both layers, dried films or layers tend to dissolve upon application of a second layer to a previously solidified first layer. The crosslinking in the first solidified organic layer can substantially prevent this from occurring to a much greater degree compared to a similar organic layer that is not crosslinked. This being described, it is noted that the solvent of the first solvent-containing organic layer and the solvent of the second solvent-containing organic layer can also be different. Even so, the solvent of the second solvent-containing organic layer may still be capable of dissolving or mobilization of components in the first solidified organic layer when contacted therewith, or introduce other changes to the properties of the organic layer, e.g., swelling, chemical modification, density change, washing out of desired components, etc. As with the previous embodiments, crosslinking in the first solidified organic layer can also help prevent this from occurring.

As a further advantage, a crosslinked, solidified organic layer can suppress redistribution of materials, e.g., nanoscale features, within an organic film while its own solvent is removed to form the first solidified organic layer. Thus, not only are there problems with resolublization and redistribution of materials upon application of secondary layers, but solvent removal from the first layer itself can cause redistribution and other issues that negatively impact the properties of the device.

In one embodiment, the solidified organic layers that are crosslinked, e.g., crosslinked polymeric layers, can be selected in such a manner that they do not interfere with the electro-optical and/or electrical function of the underlying layer material, while providing the desired protective function. In another embodiment, the polymer can be selected so that it does not interfere with the electro-optical and electrical properties of the organic film in which nanoscale features are embedded. In yet another embodiment, the incorporation of a crosslinked polymer can be selected so that, in addition to preventing dissolution or other destructive properties from being introduced, the crosslinked polymer could also improve certain properties, e.g., provide a beneficial change of the dielectric constant, increase in conductivity, improvement of the luminescence efficiency, etc.

Examples of technology that can benefit from the preparative systems and methods of the present invention include photodiodes, light-emitting diodes (LEDs), Schottky diodes, organic electroluminescent (EL) devices, light-emitting organics (LEOs), photovoltaic cells, field effect transistors, phototransistors, thin-film transistors, organic transistors, organic resistors, phosphorescent OLEDs, organic semiconductor lasers, organic and inorganic hybrid devices, photoreceptors, conductors, photoconductors such as organic photoconductors for laser printers, copiers, and Indigo engines, and the like. Layers of these devices can be prepared by depositing organic thin films, such as by spin casting or coating, vacuum deposition, self assembly, printing, etc.

Many of these devices utilize a hole transport layer (HTL) and an electron transport layer (ETL) to promote a desired function. HTL and ETL systems can be used to favorably describe advantages of the present invention. Thus, turning to FIG. 1, an exemplary HTL/ETL system 10 is shown, which includes a support substrate 12, e.g., glass, plastic, ceramic, a silicon-containing substrate, etc. having an anode 14 deposited thereon. The anode can be of any material known to be useful with HTL/ETL devices, such as p-Si anodes, indium-tin oxide (ITO) anodes, silver-based anodes, large work function metals, etc.

To the anode 14 is deposited a hole transport layer 16 and emissive layer, which can include either small molecule or polymer material such as N,N'-Di-[(1-naphthalenyl)-N,N'-diphenyl]-(1,1'-biphenyl)-4,4'-diamine (NPB), 4,4',N,N'-diphenylcarbazole, 1,3,5-tris(3-methyldiphenylamino)benzene, N,N'-bis(1-naphthalenyl)-N,N'-bis(phenylbenzidine), N,N'-bis(3-methylphenyl)-N,N'-bis(phenyl)benzidine, N,N'-bis(2-naphthalenyl)-N,N'-bis(phenylbenzidine), 4,-4', 4"-tris (N,N-phenyl-3-methylphenylamino)triphenylamine, poly(9,9-dioctylfluorenyl-2,7-diyl)-co-(N,N'-bis(4-butylphenyl-1,1'-biphenylene-4,4-diamine), poly(N,N'-bis(4-butylphenyl)-N,N'-bis(phenyl)benzidine, poly(9,9-dihexylfluorenyl-2,7-diyl)-co-(N,N'-bis(p-butylphenyl)-1,4-diaminophenylne), poly(9,9-dioctylfluorenyl-2,7-diyl)-co-(N,N'-diphenyl)-N,N'-di(p-butylphenyl-1,4-diaminebenzene), or poly(9,9-dioctylfluorneyl)-co-N-(4-butylphenyl)diphenylamine.

To the hole transport layer 16 and emissive layer, is deposited an electron transport layer 18, which can include any material useful for such layers. The electron transport materials are usually small molecules or polymers that contain nitrogen/oxygen containing p-electron deficient heterocyclics, such as oxadiazoles, triazoles, triazines, pyridines, pyrimidines, quinolines, quinoxalines and extended benzo derivatives these such as pyrimido pyrimidines. It includes, but not limit to, 2-(4-biphenylyl)5-(4-tert-butylphenyl)-1,3,4-oxadiazole (PBD), 2,5-bis(naphthyl)1,3,4-oxadiazole (BND), poly(arylene-1,3,4-oxadizaole)s, poly(1,3,4-oxadiazole)s, substituted 1,2,4-triazoles and polymeric 1,2,4-triazoles, substituted 1,3,5-triazines substituted quinoxalines, tris (8-hydroxyquinoline)aluminum ($Alq_3$), 2,5-polypyridines, 3,5-polypyridines, poly(9,9-dioctylfluorenyl-2,7-diyl)-co-poly(1,3,4-oxadiazole), poly((9,9-dioctylfluorenyl-2,7-diyl)-co-poly-(2,5-pyridine), or poly((9,9-dioctylfluorenyl-2,7-diyl)-co-poly-quinoxaline).

Next, to the electron transport layer 18 is deposited a cathode 20, which can be of any material known to be useful with HTL/ETL devices, such as Mg:Ag cathodes, Ba:Ag cathodes, LiF/Al cathodes, Al cathodes, Ca cathodes, Ba cathodes, small work function metal cathodes, carbon nanotubes cathodes, etc.

The circuit between the anode 14 and the cathode 20 is closed 22 to active the device, thereby resulting in illumination 24 when the device is a light emitting device.

It should be noted that the order of deposition described in this example is merely exemplary, and could be modified as would be ascertainable by one skilled in the art after considering the principles of the present invention described herein.

More generally, organic emitter layers (HTL 16 and ETL 18 layers) are sandwiched between two electrodes (anode 14 and cathode 20). Electrical energy can then be transformed into light through the excitation of the organic molecules. There are various types of excitation mechanisms, including exciton formation or reaction of charge carriers, including radical anion (electrons) and radical cation (holes), which are sent into the organic layers from the electrodes. Thus, in one embodiment, this interaction can generate luminescence from the ETL layer.

In the embodiment shown in FIG. 1, and in accordance with embodiments of the present invention, it is noted that the hole transport layer 16 can be formulated as part of a crosslinked, solidified organic layer. Thus, when the electron transport layer 18 is deposited thereon, minimal dissolution or mobilization of components in the solidified layer is experienced. In other words, in this embodiment, the device shown can be part of an organic/polymeric light emitting diode. Since both layers include materials that are frequently soluble in similar solvents, incorporation of the hole transport layer into the inert crosslinked polymer network can suppress its dissolution, while at the same time, maintain its electronic properties.

By way of an alternative example, often, nanoscale features, such as nanocrystals or small molecules, are incorporated into a device, similar to that shown in FIG. 1, in order to provide a specific functionality dependent on the location and/or dispersion of nanoscale features within the polymer film(s). Subsequent processes, like diffusion, phase separation, and nanoscale features, e.g., nanocrystal, agglomeration can disturb the desired nanofeature distribution. The crosslinked, solidified organic layer or inert polymer can be incorporated into the structure in order to immobilize the nanoscale features, thus preserving the desired nanoscale feature distribution.

The crosslinked, solidified organic layers described herein can include inert polymer networks formed by using a mixture of crosslinkable monomer, oligomers, and polymers, in addition to crosslinking agent and an initiator. The crosslinking agent can be a 2-branch, 3-branch, 4-branch crosslinker, or mixture thereof, which can be initiated with appropriate energy, e.g., chemical energy, photo energy, thermal energy, etc. One resin type that can be used is a polyimide resin having one or more primary alcoholic groups with an alcoholic equivalent of about 3,500 or less, where the polyimide is soluble in an organic solvent and has a weight average molecular weight of from 5,000 Mw to 500,000 Mw. Other resin types that can be used include condensates of an amino compound modified with formalin, melamine resins modified with formalin, urea resins modified with formalin, phenol compounds having methylol groups and/or an alkoxy methylol group, each of which being optionally modified further with alcohol. Other resins that can be used include photo acid generators capable of generating an acid upon irradiation with light of a wavelength of from 240 nm to 500 nm. Still other examples include UV- or thermal-initiated crosslinkable acrylate monomers and crosslinkers. In one embodiment, a cross linked polyacrylate network can be formed from a co-monomer mixture comprising 5 wt % to 20 wt % nitrogen-containing monomer, which serves as hydrophilic monomer as well as chain propagation accelerator; 20 wt % to 80 wt % of two-branch acrylate cross linking monomer; 5 wt % to 20 wt % of three-branch or four-branch cross linking monomer to increase cross linking density; and 1 wt % to 10 wt % of photo or thermal initiator.

EXAMPLES

The following examples illustrate the embodiments of the invention that are presently best known. However, it is to be understood that the following are only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following examples provide further detail in connection with what are presently deemed to be the most practical and preferred embodiments of the invention.

Example 1

Commercially available crosslinking polymer (EBAD, ethoxylated Bisphenol A dimethacrylate) was used as a material in forming a matrix for a hole transport layer (HTL) (poly(9,9-dioctylfluorene-co-N-(4-butylphenyl)diphenylamine), along with a polyfluorene derivative for emitting a green light beam (ADS132GE from American Dye Source). Specifically, in preparation, the EBAD was diluted by toluene, and then the ADS132GE was added and dissolved. The solution was spin-coated on an indium-tin oxide (ITO) substrate and then exposed to UV at 365 nm at 150 mW/cm$^2$ for 3 minutes to crosslink the polymer. A crosslinked organic layer with a green light emitting material was formed.

Example 2

Figure 2:
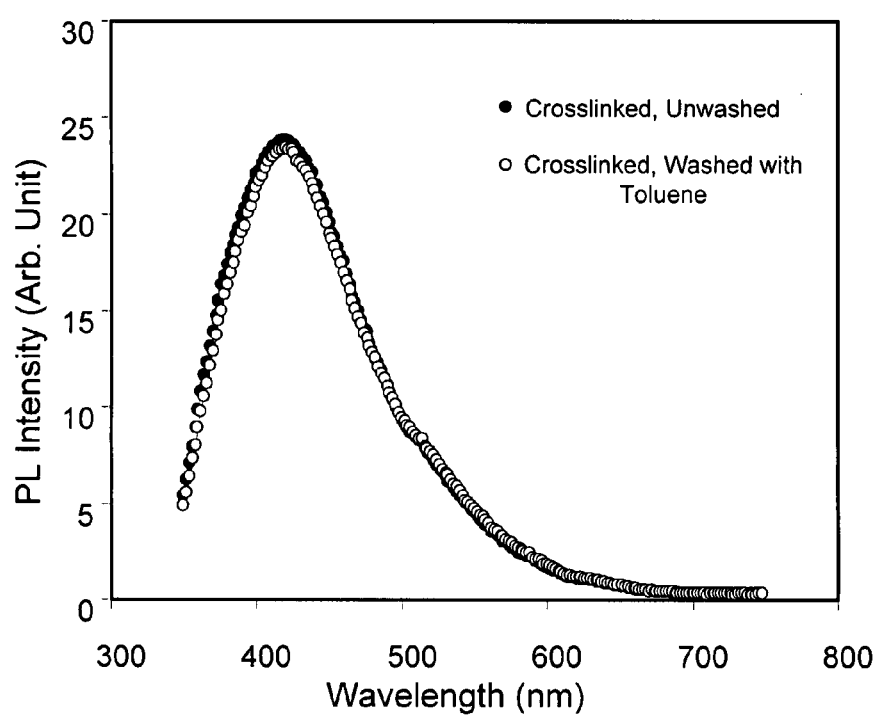
FIG. 2 sets forth a comparison of two photoluminescent spectrum curves, one for a structure that has been washed with an organic solvent compared to one that has not.

The crosslinked hole transport layer (HTL) of Example 1 was confirmed to be smooth and appropriately thick after crosslinking using Atomic Force Microscopy (AFM); and further, after washing with toluene, the morphology and thickness did not significantly change, if at all, as also confirmed by AFM. Further, the photoluminescence properties from hole transport layer of Example 1 did not appreciably change, indicating that crosslinking polymer is an excellent matrix for carrying the luminescent material of hole transport material, even when exposed to an otherwise solvating solvent. FIG. 2 further confirms that prior to washing with toluene and after washing with toluene, virtually no damage to the material occurred, as the photoluminescent spectrum curve remained substantially identical.

Example 3

Figure 3:
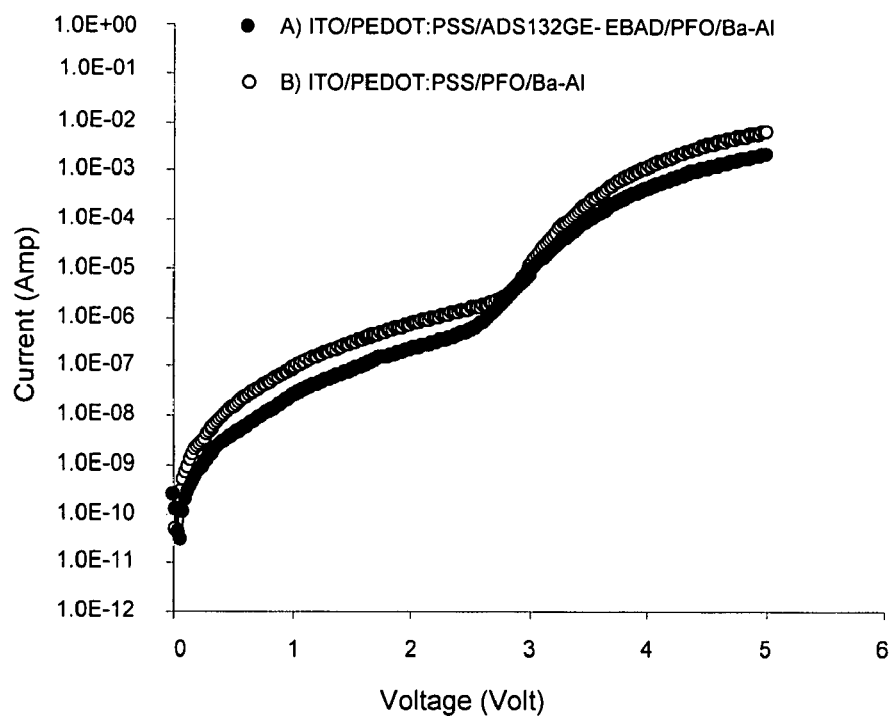
FIGS. 3 and 4, viewed together, set forth a comparison of electrical properties for a structure prepared in accordance with embodiments of the present invention, as compared to the prior art.
Figure 4:
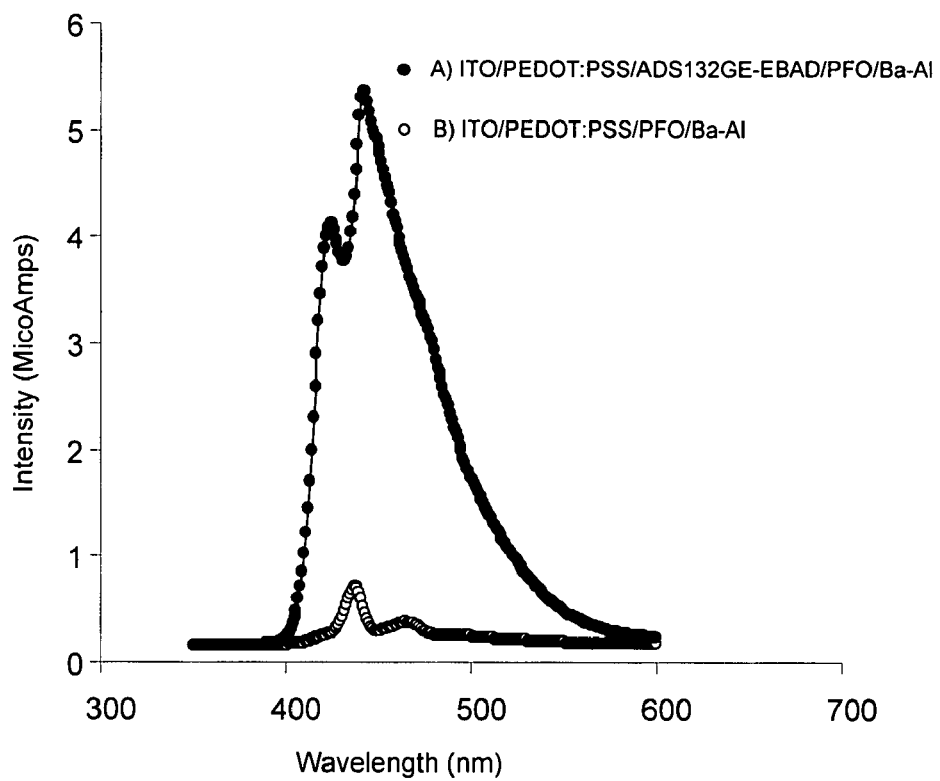

A commercially available crosslinking material (EBAD, ethoxylated Bisphenol A dimethacrylate was investigated for incorporating into various hole transport layers (HTL). A polyfluorene derivative for emitting a green light beam (ADS132GE from American Dye Source) was used with these various materials to form the HTLs for OLED devices. Two devices were formed (one with crosslinker referred to in FIGS. 3 and 4 as A, and one without crosslinker referred to in FIGS. 3 and 4 as B). Specifically, poly(3,4-ethylenedioxythiophene) poly(styrenesulfonate) (PEDOT:PSS) was deposited on indium-tin oxide (ITO) glass by spincoating. Two samples were then prepared for testing. A first sample did not have an HTL/electron blocking (EBL) mechanism, while the other sample was coated with the ADS132GE bound in EDAB as the HTL/EBL, and then thermally cross linked. Poly(9,9-dioctylfluorenyl-2,7-diyl) (PFO) was used as emitting material. After coating the PFO thereon, Ba and Al was deposited by thermal evaporation as a cathode. The selected HTL ADS132 has a LUMO energy level that provides a barrier to effectively block electrons coming from the cathode. This electron blocking mechanism can reduce the leakage current as evidenced in FIG. 3 (compare curve A to curve B), which improves external emission efficiency (see also FIG. 4). This result demonstrates the effectiveness on HTL structural protection offered by a cross-linked organic layer, and the resultant preservation of HTL electrical properties.

Example 4

The same procedure was followed as in Example 3, except that UV curable NOA83H (Norland Optical Adhesive 83H) was used rather than thermally curable EDAB as the crosslinking material. The UV cured binder NOA83H (not shown in FIGS.) is even better than the thermally cured binder EBAD in blocking leakage current (electron blocking). This may be due to the extremely high resistively of NOA83H. It is also noted that the HTL/EBL with the NOA83H binder has higher luminescent efficiency. The enhancement of electroluminescence efficiency is also owing to a more balanced electron and hole injection by introducing an HTL. This result demonstrates the effectiveness on HTL structural protection offered by a cross-linked organic layer, and the resultant preservation of HTL electrical properties.

Example 5

In each of the above examples, it is noted that the polyfluorene derivatives for emitting light that were used were ADS132E (green light beam). However, other polyfluorene derivatives from American Dye Source, Inc. (and/or others) can be substituted for the ADS132E (or used together), such as ADS100RE (red light beam) and/or ADS135BE (blue light beam).

While the invention has been described with reference to certain preferred embodiments, those skilled in the art will appreciate that various modifications, changes, omissions, and substitutions can be made without departing from the spirit of the invention. It is therefore intended that the invention be limited only by the scope of the appended claims.

What is claimed is:

1. A layered electro-organic device, comprising:
   a) a first solidified organic layer deposited on a substrate, wherein the first solidified organic layer includes a crosslinked polymer and a material providing an electrical function to the first solidified organic layer, wherein the crosslinked polymer does not interfere with the electrical function, and
   b) a second solidified organic layer directly deposited on the first solidified organic layer, wherein the first solidified organic layer and the second solidified organic layer are formulated for electrical communication with one another, and wherein the first solidified organic layer and the second solidified organic layer are collectively no more than 100 μm in thickness.

2. The device of claim 1, prepared by:
   applying a first solvent-containing organic layer to a substrate;
   removing solvent from the first solvent-containing organic layer to form the first solidified organic layer;
   applying a second solvent-containing organic layer to the first solidified organic layer; and
   removing solvent from the second solvent-containing organic layer to form the second solidified organic layer, wherein the crosslinked polymer suppresses negative impact to the first solidified organic layer when the solvent of the second solvent-containing organic layer is deposited on the first solidified organic layer.

3. The device of claim 1, wherein the substrate is an anode, a cathode, or a previously applied organic thin film.

4. The device of claim 1, wherein the second solidified organic layer also includes a crosslinked polymer.

5. The device of claim 1, wherein the first solidified organic layer is a crosslinked polymer layer, or the first solidified organic layer includes nanofeatures which are supported by a crosslinked polymer matrix.

6. The device of claim 1, wherein the layered electro-organic device is a photodiode, light-emitting diode, Schottky diode, organic electroluminescent device, light-emitting organic, photovoltaic cell, field effect transistor, phototransistor, thin-film transistor, organic transistor, organic resistor, phosphorescent OLED, organic semiconductor laser, organic and inorganic hybrid devices, photoreceptors, conductor, or photoconductor.

7. The device of claim 1, wherein the crosslinked polymer provides a positive attribute to the electrical function of the first solidified organic layer.

8. The device of claim 7, wherein the positive attribute includes higher resistivity in an organic resistor, stronger luminescence in luminescent device, shift of a luminescence peak in a luminescent device, or enhanced conductivity.

9. A method of forming a layered electro-organic device as in claim 1 comprising:
applying a first solvent-containing organic layer to the a substrate;
removing solvent from the first solvent-containing organic layer to form the a first solidified organic layer;
applying a second solvent-containing organic layer to the first solidified organic layer;
and
removing solvent from the second solvent-containing organic layer to form the second solidified organic layer,
wherein the first solidified organic layer which is crosslinked, suppresses negative impact to the first solidified organic layer when the solvent of the second solvent-containing organic layer is deposited on the first solidified organic layer.

10. The method of claim 9, wherein the negative impact is at least one of dissolution, mobilization of components, swelling, chemical modification, density change, or washing out of desired components with respect to mechanical, optical, or electrical properties of the first solidified organic layer.

11. The method of claim 9, wherein the first solvent-containing organic layer includes a UV crosslinkable polymer or thermal crosslinkable polymer, and the solidified organic layer is formed and crosslinked using UV energy or thermal energy, respectively.

12. The method of claim 9, wherein the substrate is an anode or a cathode.

13. The method of claim 9, wherein the substrate is a previously applied organic thin film.

14. The method of claim 9, wherein the second solidified organic layer also includes a crosslinked polymer.

15. The method of claim 9, wherein the first solidified organic layer and the second solidified organic layer are collectively no more than 100 µm in thickness.

16. The method of claim 9, wherein the solvent of the first solvent-containing organic layer and the solvent of the second solvent-containing organic layer have at least one specific solvent in common, or wherein the solvent of the first solvent-containing organic layer and the solvent of the second solvent-containing organic layer are the same.

17. The method of claim 9, wherein the solvent of the first solvent-containing organic layer and the solvent of the second solvent-containing organic layer are different, but wherein the solvent of the second solvent-containing organic layer is capable of causing a negative impact to the first solidified organic layer when contacted therewith.

18. The method of claim 9, wherein the first solidified organic layer includes organic particles, inorganic particles, or nanotubes with an average size below 100 nm which are supported by a crosslinked polymer matrix.

19. The method of claim 9, wherein the layered electro-organic device is a photodiode, light-emitting diode, Schottky diode, organic electroluminescent device, light-emitting organic, photovoltaic cell, field effect transistor, phototransistor, thin-film transistor, organic transistor, organic resistor, phosphorescent OLED, organic semiconductor laser, organic and inorganic hybrid devices, photoreceptors, conductor, or photoconductor.

20. The method of claim 9, wherein the first solvent-containing organic layer is crosslinked by applying a crosslinking material to the surface of the first solvent-containing organic layer to for the first solidified organic layer, and wherein the second solvent-containing organic layer is applied thereto.

21. The method of claim 9, wherein the first solidified layer is prepared using a photo acid generator capable of generating an acid upon irradiation with light of a wavelength of from 240 nm to 500 nm.

22. The method of claim 9, wherein the first solidified organic layer is a crosslinked, hole transport layer.

23. The method of claim 22, wherein the second solidified organic layer is an electron transport layer that does not contain crosslinking agent.

24. The method of claim 22, wherein the second solidified organic layer is a crosslinked electron transport layer.

* * * * *

UNITED STATES PATENT AND TRADEMARK OFFICE
CERTIFICATE OF CORRECTION

PATENT NO.        : 8,003,980 B2
APPLICATION NO.   : 11/700447
DATED             : August 23, 2011
INVENTOR(S)       : Xia Sheng et al.

Page 1 of 1

It is certified that error appears in the above-identified patent and that said Letters Patent is hereby corrected as shown below:

In column 9, line 2, in Claim 9, delete "claim 1" and insert -- claim 1, --, therefor.

In column 9, line 3, in Claim 9, delete "the a" and insert -- the --, therefor.

In column 9, line 16, in Claim 9, delete "the a" and insert -- the --, therefor.

Signed and Sealed this
Seventeenth Day of April, 2012

David J. Kappos
*Director of the United States Patent and Trademark Office*